United States Patent
Chang

[19]

[11] Patent Number: 6,001,742
[45] Date of Patent: Dec. 14, 1999

[54] METHOD FOR ETCHING TANTALUM OXIDE LAYER

[75] Inventor: Yi-Chun Chang, Chung-Li, Taiwan

[73] Assignee: United Microelectronics Corp., Taipei, Taiwan

[21] Appl. No.: 09/074,639

[22] Filed: May 7, 1998

[30] Foreign Application Priority Data

Apr. 3, 1998 [TW] Taiwan ................................. 87105068

[51] Int. Cl.$^6$ ................................................. H01L 21/30
[52] U.S. Cl. .......................... 438/706; 438/714; 438/720; 438/723
[58] Field of Search ..................... 438/706, 712, 438/714, 720, 738, 743, 723

[56] References Cited

U.S. PATENT DOCUMENTS

| | | | |
|---|---|---|---|
| 4,997,746 | 3/1991 | Greco et al. | 438/672 |
| 5,445,710 | 8/1995 | Hori et al. | 156/643.1 |
| 5,668,379 | 9/1997 | Ono et al. | 257/59 |
| 5,688,719 | 11/1997 | Tsai et al. | 438/780 |
| 5,726,102 | 3/1998 | Lo | 438/718 |

FOREIGN PATENT DOCUMENTS

| | | |
|---|---|---|
| 0 560 575 A1 | 9/1993 | European Pat. Off. . |
| 0 795 896 A2 | 9/1997 | European Pat. Off. . |
| 2 313 708 | 5/1997 | United Kingdom . |

OTHER PUBLICATIONS

T. Kanniainen, H. Kattelus and J. Skarp, Growth of Dielectric $HfO_2/Ta_0O5$ Thin Film Nanolaminate Capacitors by Atomic Layer Epitaxy, pp. 36–46.

*Primary Examiner*—Robert Kunemund
*Assistant Examiner*—Kin-Chan Chen
*Attorney, Agent, or Firm*—Thomas, Kayden, Horstemeyer & Risley

[57] ABSTRACT

A method of etching tantalum oxide layer in the fabrication of dynamic random access memory (DRAM). The method comprises the steps of forming the lower electrode structure of a capacitor on a semiconductor substrate. Then, a tantalum oxide layer, a barrier layer and a conductive layer are sequentially formed over the lower electrode structure and the substrate. Next, the conductive layer is patterned using a first reactive gas that includes a gaseous mixture of boron trichloride, chlorine and nitrogen ($BCl_3/Cl_2/N_2$). Thereafter, the barrier layer is patterned using a second reactive gas that includes a gaseous mixture of boron trichloride, chlorine and nitrogen ($BCl_3/Cl_2/N_2$). Finally, the tantalum oxide layer is patterned using a third reactive gas that includes a gaseous mixture of boron trichloride, chlorine and nitrogen ($BCl_3/Cl_2/N_2$).

28 Claims, 2 Drawing Sheets

METHOD FOR ETCHING TANTALUM OXIDE LAYER

CROSS-REFERENCE TO RELATED APPLICATION

This application claims the priority benefit of Taiwan application serial no. 87105068, filed Apr. 3, 1998.

BACKGROUND OF THE INVENTION

1. Field of Invention

The present invention relates to a method for etching a tantalum oxide ($Ta_2O_5$) layer. More particularly, the present invention relates to a method of manufacturing dynamic random access memory (DRAM) that involves the sequential etching of a polysilicon layer and a tantalum oxide layer to form a pattern without having to switch etching stations.

2. Description of Related Art

A conventional dynamic random access memory (DRAM) structure at least includes a metal oxide semiconductor (MOS) transistor and a capacitor. The gate of the transistor is connected to a word line, and one of the source/drain regions is connected to a bit line BL. The other source/drain region is electrically connected to a capacitor, which in turn is connected to a ground. The capacitor structure in a DRAM can be regarded as a critical component in data storage. If the number of charges stored by a capacitor is large, the data bit stored in the capacitor is more stable. When the data bit stored in the capacitor is read out by an amplifier, a large capacitance is more capable of combating external noise.

In semiconductor manufacturing, a DRAM capacitor is formed by several steps. First, at least one transistor structure is formed on a semiconductor substrate, and then a storage node is formed above one of the source/drain regions of the transistor, thereby forming the lower electrode structure of a capacitor. Next, a tantalum oxide layer, a titanium nitride layer (TiN) and a polysilicon layer are formed sequentially over the lower electrode structure. The titanium nitride layer is formed above the tantalum oxide layer, and the two layers together constitute a composite dielectric layer for the capacitor. The polysilicon layer acts as an upper electrode structure of the capacitor. Finally, the tantalum oxide layer, the titanium nitride layer and the polysilicon layer are patterned to complete the DRAM capacitor structure.

FIG. 1 is a flow diagram showing the conventional manufacturing steps in patterning a multi-layered capacitor structure. First, step 10 represent the beginning of the operation where the multi-layered structure of the capacitor, including the lower electrode structure, the tantalum oxide layer, the titanium nitride layer and the polysilicon layer, has already been deposited. Next, step 12 is carried out by first performing a photolithographic operation, and then etching the polysilicon layer to form the upper electrode structure of the capacitor. Preferably, the etchant for etching the polysilicon layer is a gaseous mixture containing $HBr/Cl_2/He$—$O_2$. Thereafter, a change in etching station is performed in step 14. The change is necessary because the etchant for etching the polysilicon layer is unsuitable for etching the tantalum oxide layer and the titanium nitride layer. Next, step 16 is carried out etching the titanium nitride layer and the tantalum oxide layer ($TiN/Ta_2O_5$), thereby patterning the composite dielectric layer of the capacitor.

In patterning the tantalum oxide layer, the titanium nitride layer and the polysilicon layer, some problems often arise. The most severe problem occurs when etching of the polysilicon layer is finished, and the titanium nitride layer needs to be etched next. The etchant for etching the polysilicon layer is a gaseous mixture containing $HBr/Cl_2/He$—$O_2$, which is unsuitable for etching titanium nitride. Therefore, both the processing station and the etchants need to be changed before subsequent etching of the titanium nitride layer and the tantalum oxide can be performed. This switchover of processing station and etchants increases the number of processing steps. Moreover, some residual etchants used in etching the polysilicon layer may be carried over into the next etching operation. When they come into contact with the titanium nitride layer, some metallic ion dissociation may occur. Consequently, the reaction chamber may be contaminated.

In light of the foregoing, there is a need to improve the process of etching the polysilicon layer, the titanium nitride layer and the tantalum oxide layer.

SUMMARY OF THE INVENTION

Accordingly, the present invention provides a method of etching a tantalum oxide layer that uses innovative etchants including a gaseous mixture containing boron trichloride, chlorine and nitrogen ($BCl_3/Cl_2/N_2$). Using the gaseous mixture, the multi-layered structure of a capacitor can be etched in a single etching operation; moreover, there is no contamination of the reaction chamber.

To achieve these and other advantages and in accordance with the purpose of the invention, as embodied and broadly described herein, the invention provides a method of etching tantalum oxide layer in the fabrication of DRAM. The method comprises the steps of forming the lower electrode structure of a capacitor on a semiconductor substrate and then sequentially forming a tantalum oxide layer, a barrier layer and a conductive layer over the substrate and the lower electrode structure. Next, the conductive layer is patterned using a first reactive gas that includes a gaseous mixture of boron trichloride, chlorine and nitrogen ($BCl_3/Cl_2/N_2$). Thereafter, the barrier layer is pattern using a second reactive gas that includes a gaseous mixture of boron trichloride, chlorine and nitrogen ($BCl_3/Cl_2/N_2$). Finally, the tantalum oxide layer is patterned using a third reactive gas that includes a gaseous mixture of boron trichloride, chlorine and nitrogen ($BCl_3/Cl_2/N_2$).

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
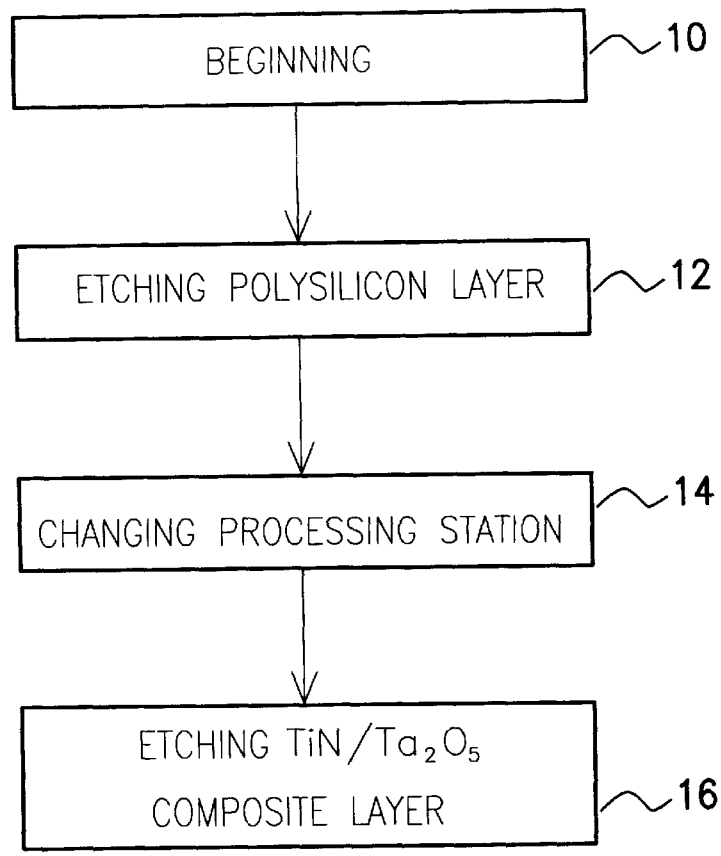
FIG. 1 is a flow diagram showing the conventional manufacturing steps in patterning a multi-layered capacitor structure.

Reference will now be made in detail to the present preferred embodiments of the invention, examples of which are illustrated in the accompanying drawings. Wherever possible, the same reference numbers are used in the drawings and the description to refer to the same or like parts.

This invention provides an innovative etchant that contains a gaseous mixture of boron trichloride, chlorine and nitrogen ($BCl_3/Cl_2/N_2$). The characteristic property of this etchant is that it can etch polysilicon, titanium nitride (TiN) and tantalum oxide ($Ta_2O_5$). Therefore, a single etching operation can be used to form the multi-layered structure of a capacitor. Moreover, the method is capable of reducing severe contamination of the reaction chamber.

Figure 2A:
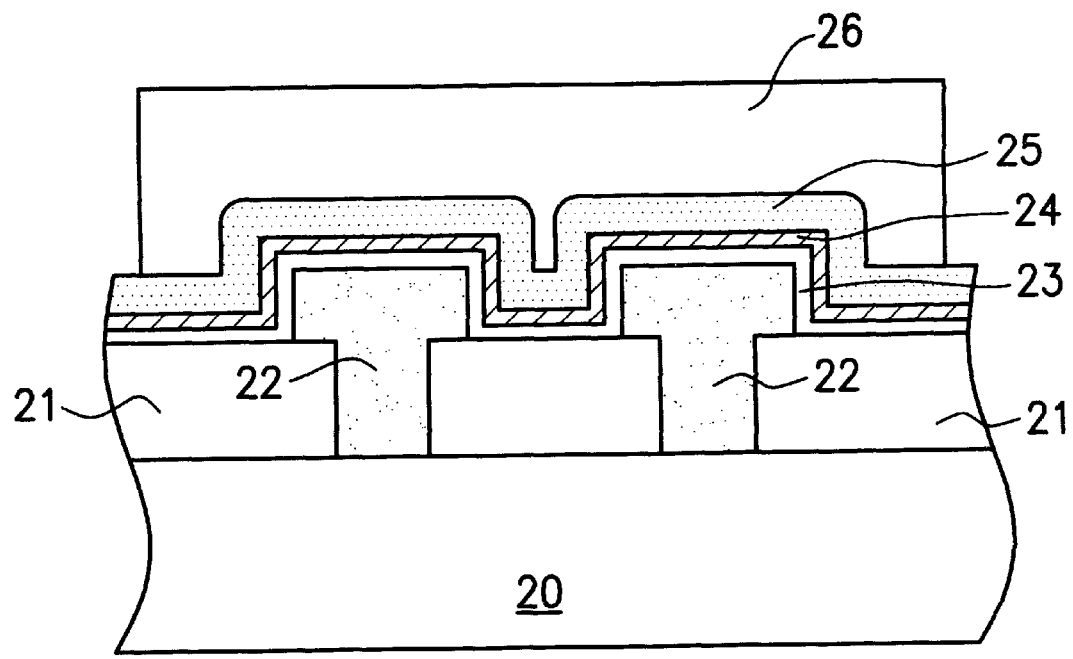
FIGS. 2A and 2B are cross-sectional views showing the progression of manufacturing steps in patterning a multi-layered capacitor structure (including a tantalum oxide layer) on a capacitor according to one preferred embodiment of this invention.
Figure 2B:
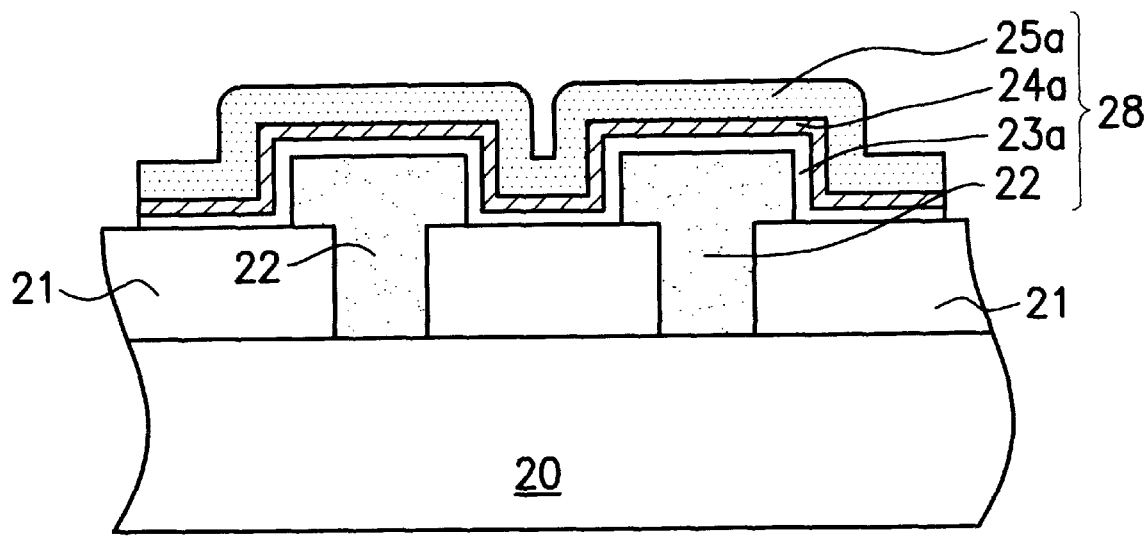

FIGS. 2A and 2B are cross-sectional views showing the progression of manufacturing steps in patterning a multi-layered capacitor structure (including a tantalum oxide layer) on a capacitor according to one preferred embodiment of this invention. First, as shown in FIG. 2A, a patterned insulating layer 21 is formed over a semiconductor substrate 20. Next, the lower electrode structure 22 of a capacitor, for example, a polysilicon layer is formed in the insulating layer 21 for electrically connecting a source/drain region (not shown) in the substrate 20. Thereafter, a multi-layered structure is formed over the lower electrode structure 22 and the insulating layer 21. The multi-layered structure is formed by depositing a thin tantalum oxide layer 23, a thin titanium nitride layer 24 and a polysilicon layer 25. The titanium nitride layer 24 is formed over the tantalum oxide layer 23, and the two layers together form a composite dielectric structure. Since tantalum oxide has a very high dielectric constant of about 20 to 30, the tantalum oxide layer 23 is capable of increasing the capacitance of the capacitor. Hence, the tantalum oxide layer has applications in fabricating 16M DRAM. Subsequently, a photoresist layer 26 is formed over the polysilicon layer 25.

Next, as shown in FIG. 2B, photolithographic and etching operations are carried out using the photoresist layer 26 as a mask. The polysilicon layer 25, the thin titanium nitride layer 24 and the thin tantalum oxide layer 23 are etched sequentially using the characteristic etchant of this invention. The etchant is a gaseous mixture including boron trichloride, chlorine and nitrogen ($BCl_3/Cl_2\ N_2$). The ingredients of the gaseous mixture are mixed together in a ratio according to Table 1 below.

TABLE 1

Relative gas flow rate of gaseous ingredients for etching polysilicon, titanium nitride and tantalum oxide.

| Ingredients (Gaseous) | Gas Flow Rate (Unit:sccm) |
| --- | --- |
| Chlorine ($Cl_2$) | 20–80 |
| Boron Trichloride ($BCl_3$) | 20–80 |
| Nitrogen ($N_2$) | 20–80 |

In Table 1, the unit sccm refers to the gas flow rate in standard cubic centimeter per minute, and each ingredient in the gaseous mixture performs a definite function. For example, chlorine $Cl_2$ is a main reactive gas for etching, boron trichloride $BCl_3$ is used as an agent for carrying out physical bombardment, and the gaseous nitrogen functions as sidewall passivation material.

Figure 3:
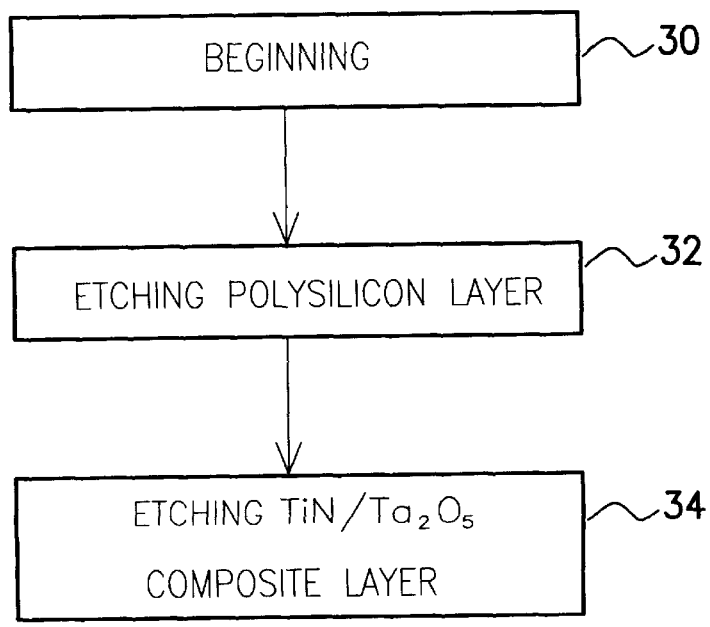
FIG. 3 is a flow diagram showing the steps in patterning a multi-layered capacitor structure according to the preferred embodiment of this invention.

FIG. 3 is a flow diagram showing the steps in patterning a multi-layered capacitor structure according to the preferred embodiment of this invention. First, step 30 represent the beginning of the operation where the multi-layered structure of the capacitor, including the lower electrode structure, the tantalum oxide layer, the titanium nitride layer and the polysilicon layer, has already been deposited. Next, step 32 is carried out by first performing a photolithographic operation, and then etching the polysilicon layer to form the upper electrode structure of the capacitor. Preferably, the etchant for etching the polysilicon layer is a gaseous mixture of boron trichloride, chlorine and nitrogen ($BCl_3/Cl_2/N_2$). Next, step 34 is carried out, etching the titanium nitride layer and the tantalum oxide layer ($TiN/Ta_2O_5$) to form the composite dielectric structure of the capacitor. Preferably, the etchant for etching the polysilicon layer is a gaseous mixture of boron trichloride, chlorine and nitrogen ($BCl_3/Cl_2/N_2$). Hence, a complete capacitor structure is formed in a single etching operation using the gaseous mixture including boron trichloride, chlorine and nitrogen.

In summary, the method of etching tantalum oxide layer provided by this invention has the following advantages including:

(1) The etchant provided by this invention, namely, a gaseous mixture having the ingredients $BCl_3/Cl_2/N_2$, is capable of etching a polysilicon layer, a titanium nitride layer and a tantalum oxide layer to form a uniform pattern.

(2) The etchant provided by this invention, namely, a gaseous mixture having the ingredients $BCl_3/Cl_2/N_2$, is able to etch a pattern out of the multi-layered structure in a single etching operation. Therefore, processing steps are saved.

(3) The etchant used in this invention does not dissociate metallic ions on contact with a titanium nitride layer. Therefore, contamination of reaction chamber is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for etching a multi-layer structure including tantalum oxide, the method comprising the steps of:

providing a semiconductor substrate and then sequentially forming a first conductive structure, a dielectric layer and a second conductive layer over the substrate;

performing photolithographic and etching operations to pattern the second conductive layer, using a first reactive gas that contains boron trichloride ($BCl_3$); and performing photolithographic and etching operations to pattern the dielectric layer, using a second reactive gas that contains boron trichloride ($BCl_3$).

2. The method of claim 1, wherein the step of forming the dielectric layer includes depositing tantalum oxide ($Ta_2O_5$).

3. The method of claim 1, wherein the step of forming the second conductive layer includes depositing polysilicon.

4. The method of claim 1, wherein the flow rate of gaseous boron trichloride ($BCl_3$) in the first reactive gas is about 20 to 80 sccm.

5. The method of claim 1, wherein the first reactive gas further includes chlorine ($Cl_2$), and the flow rate of gaseous chlorine is about 20 to 80 sccm.

6. The method of claim 1, wherein the first reactive gas further includes nitrogen ($N_2$), and the flow rate of gaseous nitrogen is about 20 to 80 sccm.

7. The method of claim 1, wherein the first reactive gas includes a gaseous mixture of boron trichloride, chloride and nitrogen.

8. The method of claim 1, wherein the flow rate of gaseous boron trichloride ($BCl_3$) in the second reactive gas is about 20 to 80 sccm.

9. The method of claim 1, wherein the second reactive gas further includes chlorine ($Cl_2$), and the flow rate of gaseous chlorine is about 20 to 80 sccm.

10. The method of claim 1, wherein the second reactive gas further includes nitrogen ($N_2$), and the flow rate of gaseous nitrogen is about 20 to 80 sccm.

11. The method of claim 1, wherein the second reactive gas includes a gaseous mixture of boron trichloride, chloride and nitrogen.

12. The method of claim 1, wherein after forming the dielectric layer, further includes depositing a barrier layer over the dielectric layer before depositing the second conductive layer, and then the barrier layer is patterned using a gaseous mixture that includes boron trichloride, chloride and nitrogen.

13. The method of claim 12, wherein the step of forming the barrier layer includes depositing titanium nitride (TiN).

14. A method for etching tantalum oxide, wherein the method is suitable for fabricating a multi-layer capacitor, the method comprising the steps of:
    providing a semiconductor substrate, forming a lower electrode structure of a capacitor, and then depositing a tantalum oxide layer and a barrier layer over the substrate;
    after depositing the tantalum oxide layer, forming a conductive layer over the substrate;
    performing photolithographic and etching operations to pattern the conductive layer by using a first reactive gas that contains boron trichloride ($BCl_3$);
    performing photolithographic and etching operations to pattern the barrier layer by using a second reactive gas that contains boron trichloride ($BCl_3$); and
    performing photolithographic and etching operations to pattern the tantalum oxide ($Ta_2O_5$) layer by using a third reactive gas that contains boron trichloride ($BCl_3$).

15. The method of claim 14, wherein the step of forming the barrier layer includes depositing titanium nitride (TiN).

16. The method of claim 14, wherein the step of forming the conductive layer includes depositing polysilicon.

17. The method of claim 14, wherein the flow rate of gaseous boron trichloride ($BCl_3$) in the first reactive gas is about 20 to 80 sccm.

18. The method of claim 14, wherein the first reactive gas further includes chlorine ($Cl_2$), and the flow rate of gaseous chlorine is about 20 to 80 sccm.

19. The method of claim 14, wherein the first reactive gas further includes nitrogen ($N_2$), and the flow rate of gaseous nitrogen is about 20 to 80 sccm.

20. The method of claim 14, wherein the first reactive gas includes a gaseous mixture of boron trichloride, chloride and nitrogen.

21. The method of claim 14, wherein the flow rate of gaseous boron trichloride ($BCl_3$) in the second reactive gas is about 20 to 80 sccm.

22. The method of claim 14, wherein the second reactive gas further includes chlorine ($Cl_2$), and the flow rate of gaseous chlorine is about 20 to 80 sccm.

23. The method of claim 14, wherein the second reactive gas further includes nitrogen ($N_2$), and the flow rate of gaseous nitrogen is about 20 to 80 sccm.

24. The method of claim 14, wherein the second reactive gas includes a gaseous mixture of boron trichloride, chloride and nitrogen.

25. The method of claim 14, wherein the flow rate of gaseous boron trichloride ($BCl_3$) in the third reactive gas is about 20 to 80 sccm.

26. The method of claim 14, wherein the third reactive gas further includes chlorine ($Cl_2$), and the flow rate of gaseous chlorine is about 20 to 80 sccm.

27. The method of claim 14, wherein the third reactive gas further includes nitrogen ($N_2$), and the flow rate of gaseous nitrogen is about 20 to 80 sccm.

28. The method of claim 14, wherein the third second reactive gas includes a gaseous mixture of boron trichloride, chloride and nitrogen.

* * * * *